(12) United States Patent
Aiba

(10) Patent No.: US 7,847,635 B2
(45) Date of Patent: Dec. 7, 2010

(54) TRANSCONDUCTANCE AMPLIFIER

(75) Inventor: Yusuke Aiba, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 20 days.

(21) Appl. No.: 12/439,093

(22) PCT Filed: Aug. 27, 2007

(86) PCT No.: PCT/JP2007/066516
§ 371 (c)(1),
(2), (4) Date: Feb. 26, 2009

(87) PCT Pub. No.: WO2008/026528
PCT Pub. Date: Mar. 6, 2008

(65) Prior Publication Data
US 2010/0013556 A1  Jan. 21, 2010

(30) Foreign Application Priority Data
Aug. 28, 2006  (JP) .............................. 2006-230785

(51) Int. Cl.
*H03F 3/45* (2006.01)
(52) U.S. Cl. ..................................... 330/254; 330/260
(58) Field of Classification Search ................. 330/254, 330/260, 305; 327/359
See application file for complete search history.

(56) References Cited

U.S. PATENT DOCUMENTS

| | | | |
|---|---|---|---|
| 4,912,425 A | 3/1990 | Kobayashi et al. | |
| 5,703,534 A | 12/1997 | Kim | |
| 6,549,074 B2 | 4/2003 | Ugajin et al. | |
| 6,590,452 B1 * | 7/2003 | van Rhijn | 330/253 |
| 7,443,241 B2 | 10/2008 | Fong et al. | |
| 7,474,154 B1 * | 1/2009 | Lee et al. | 330/260 |

FOREIGN PATENT DOCUMENTS

GB  2 335 101  9/1999

(Continued)

OTHER PUBLICATIONS

Razavi, B., "Design of Analog CMOS Integrated Circuits", Maruzen Co. Ltd., Mar. 30, 2003, pp. 556-560.

(Continued)

*Primary Examiner*—Steven J Mottola
(74) *Attorney, Agent, or Firm*—Finnegan, Henderson, Farabow, Garrett & Dunner, LLP

(57) ABSTRACT

Provided is a transconductance amplifier capable of suppressing variation in the range of a linear relationship between an input voltage and an output current depending on the magnitude of a tuning voltage Vctrl, thereby adjusting transconductance over a wider range of operating input voltages. The transconductance amplifier is configured by a differential pair formed of MOS transistors (111, 112) having a common source, MOS transistors (113, 114), amplifiers (106, 107), a voltage generator circuit (100), and a differential-pair input voltage generator circuit (120). An input differential common voltage Vcm of all differential signals inputted to the differential pair is adjusted so that a difference between Vcm and Vctrl is equal to a constant, in accordance with a change in the tuning voltage Vctrl that controls the transconductance. This enables keeping constant the range in which the transconductance amplifier can achieve good linearity.

8 Claims, 11 Drawing Sheets

FOREIGN PATENT DOCUMENTS

| | | |
|---|---|---|
| JP | 62-190908 | 8/1987 |
| JP | 1-137808 | 5/1989 |
| JP | 8-242130 | 9/1996 |
| JP | 11-251848 | 9/1999 |
| JP | 2000-151302 | 5/2000 |
| JP | 2002-237733 | 8/2002 |
| JP | 2005-354558 | 12/2005 |
| JP | 2006-080649 | 3/2006 |
| WO | WO 2008/023530 | 2/2008 |

OTHER PUBLICATIONS

Kim, Shun-Sup, "A CMOS 4X Speed DVD Read Channel IC", IEEE Journal of Solid-State Circuits, vol. 33, No. 8, pp. 1168-1178, Aug. 1998.

* cited by examiner

উ S 7,847,635 B2

TRANSCONDUCTANCE AMPLIFIER

TECHNICAL FIELD

The present invention relates to a transconductance amplifier and more particularly to a transconductance amplifier that converts a voltage into a current.

BACKGROUND ART

A transconductance amplifier is the amplifier that supplies an output current proportional to an input voltage, and generally has steady gain (or transconductance). In other words, the output current varies in proportion to the input voltage as varied over a predetermined range of operating input voltages, or equivalently, the output current is linear with respect to the input voltage.

The approach of using a pair of MOS transistors having a common source, as shown in FIG. 1, for example, is known as a conventional transconductance amplifier having good linearity between the input voltage and the output current in the predetermined range of operating input voltages. (See Non-patent Document 1.) Amplifiers 106 and 107, and MOS transistors 113 and 114 cascode-connected connections to MOS transistors 111 and 112, respectively are used so as to keep the drain voltages of the MOS transistors 111 and 112 constant to input variations at all times. Also, the transistor sizes (each of which is the ratio between a channel width and a channel length) of the MOS transistors and the tuning voltage values Vctrl and common voltages Vcm thereof are controlled by a voltage generator circuit 100 and a fixed voltage generator 119. This makes the MOS transistors 111 and 112 that form a differential pair operate in a triode region and the MOS transistors 113 and 114 operate in a saturation region. Moreover, input voltages Vip and Vin are controlled by a differential-pair input voltage generator circuit 120. The differential-pair input voltage generator circuit 120 is supplied with an input voltage Vinput and the common voltage Vcm, outputs the voltage Vip to a gate terminal of the MOS transistor 111, and outputs the voltage Vin to a gate terminal of the MOS transistor 112.

FIG. 2 shows the relationship between the input voltage and transconductance Gm obtained by differentiating the output current with respect to the input voltage, which is observed in the conventional transconductance amplifier. From FIG. 2, it can be seen that the transconductance Gm is held constant in the vicinity of zero (Vip−Vin=0) and the output current is proportional to the input voltage. The tuning voltage Vctrl may be also controlled for adjustment of the transconductance Gm, while maintaining the linearity between the input voltage and the output current. In FIG. 2, there is shown the transconductance Gm observed at the tuning voltage Vctrl as changed from a middle level to a low level and to a high level.

However, the conventional transconductance amplifier, such as shown in FIG. 1, has the problem that an increase in the tuning voltage Vctrl for the adjustment of the transconductance leads to deterioration in the linearity of the transconductance amplifier between the input voltage and the output current, as shown in FIG. 2. In other words, the range of the transconductance Gm being held constant varies depending on the magnitude of the tuning voltage Vctrl. Thus, it is necessary that the range of operating input voltages be narrowed or that the amount of change in the tuning voltage Vctrl be reduced to narrow the range of adjustment of the transconductance Gm, in order to permit the adjustment of the transconductance Gm while maintaining the linearity between the input voltage and the output current throughout the entire range of operating input voltages.

Non-patent Document 1: Behzad Razavi, translation supervised by Tadahiro Kuroda, "Design of Analog CMOS Integrated Circuits," Maruzen Co., Ltd., Jul. 30, 2005, p. 559

DISCLOSURE OF THE INVENTION

In view of the foregoing problems, an object of the present invention is to provide a transconductance amplifier capable of suppressing the variation in the range of a linear relationship between the input voltage and the output current depending on the magnitude of the tuning voltage Vctrl, thereby adjusting the transconductance over a wider range of operating input voltages.

In order to achieve the above object, the present invention provides a transconductance amplifier which supplies an output current proportional to an input voltage, including: a differential pair which is formed of first and second MOS transistors having a common source, and which operates in a triode region; a third MOS transistor of which source terminal is connected to a drain terminal of the first MOS transistor, and which operates in a saturation region; a fourth MOS transistor of which source terminal is connected to a drain terminal of the second MOS transistor, and which operates in the saturation region; a first amplifier of which negative input terminal is connected to the source terminal of the third MOS transistor and of which output terminal is connected to a gate terminal of the third MOS transistor; a second amplifier of which negative input terminal is connected to the source terminal of the fourth MOS transistor and of which output terminal is connected to a gate terminal of the fourth MOS transistor; a voltage generator circuit which generates a tuning voltage inputted to positive input terminal voltages of the first and second amplifiers, and a common voltage of first and second voltages inputted to the differential pair, so that a difference between the tuning voltage and the common voltage is equal to a constant; and a differential-pair input voltage generator circuit which is supplied with an input of the common voltage, and which generates the first voltage to be outputted to a gate terminal of the first MOS transistor, and the second voltage outputted to a gate terminal of the second MOS transistor, characterized in that the second voltage is equal to 2×(the common voltage)−(the first voltage), the input voltage is equal to a difference between the first voltage and the second voltage, and the output current is equal to a difference between a first current Ip flowing through the drain and source of the first and third MOS transistors and a second current In flowing through the drain and source of the second and fourth MOS transistors.

The transconductance amplifier may be characterized in that the voltage generator circuit includes a voltage generator, a fixed current source, and a resistance connected in series between the voltage generator and an output terminal of the fixed current source, the tuning voltage is outputted from between the voltage generator and the resistance, and the common voltage is outputted from between the resistance and the fixed current source.

The transconductance amplifier may be characterized in that the voltage generator circuit includes a voltage generator, a fixed current source, and a resistance connected in series between the voltage generator and an input terminal of the fixed current source, the common voltage is at a contact point between the voltage generator and the resistance, and the tuning voltage is at a contact point between the resistance and the fixed current source.

The transconductance amplifier may be characterized in that the voltage generator includes a second current source, fifth and sixth MOS transistors, and a third amplifier, which are connected in series, a source terminal of the sixth MOS transistor, a drain terminal of the fifth transistor, and a negative input terminal of the third amplifier are connected to one another, a gate terminal of the fifth transistor having a common source is connected to a drain terminal of the sixth MOS transistor and an output terminal of the second current source, a gate voltage of the fifth MOS transistor is the common voltage, and a positive input terminal voltage of the third amplifier is the tuning voltage.

The transconductance amplifier may be characterized in that the fifth MOS transistor is configured to have a current-mirror relationship to the first and second MOS transistors, and the sixth MOS transistor is configured to have a current-mirror relationship to the third and fourth MOS transistors.

The transconductance amplifier may be characterized in that the second current source is variable.

The transconductance amplifier may be characterized in that the voltage generator is variable.

The present invention provides the transconductance amplifier having a wide transconductance tuning range by eliminating the dependence of the range in which the transconductance amplifier has good linearity between the input voltage and the output current, upon the tuning voltage Vctrl.

BEST MODES FOR CARRYING OUT THE INVENTION

Detailed description will be given below with reference to the drawings with regard to embodiments of the present invention.

First Embodiment

Figure 1:
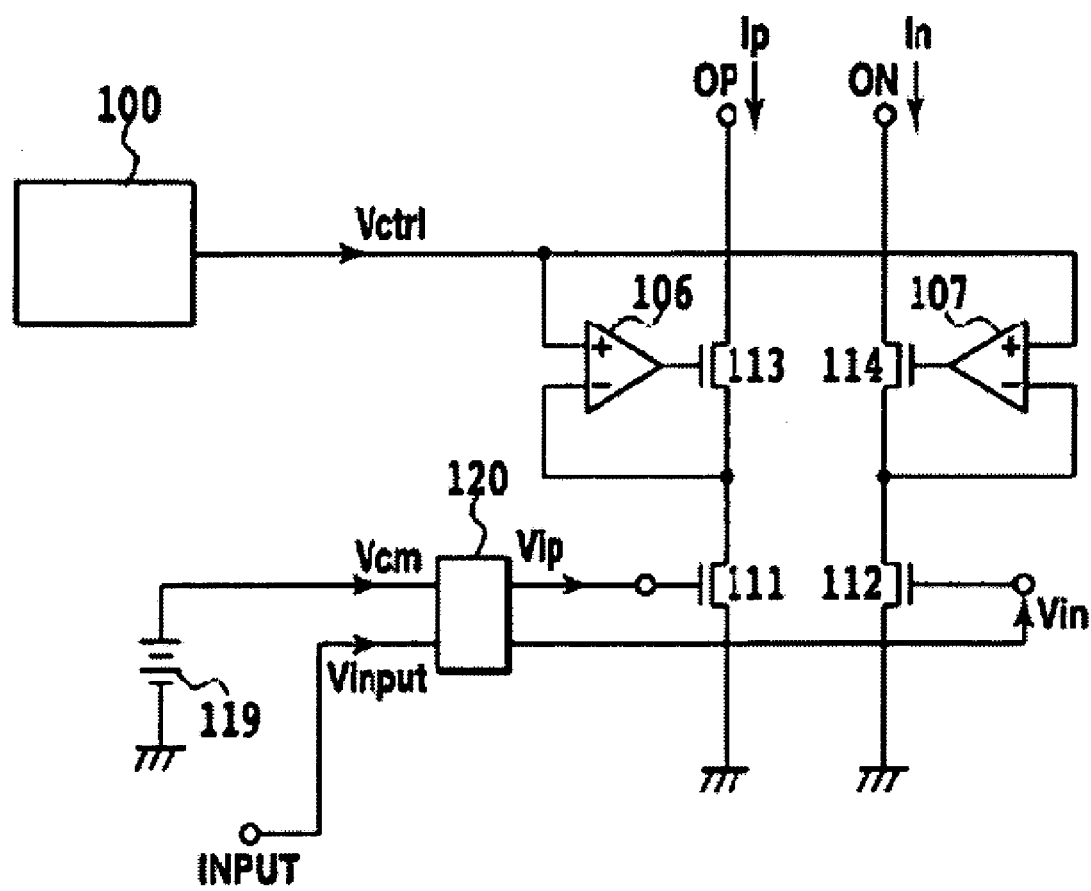
FIG. 1 is a circuit diagram of a conventional transconductance amplifier.
Figure 2:
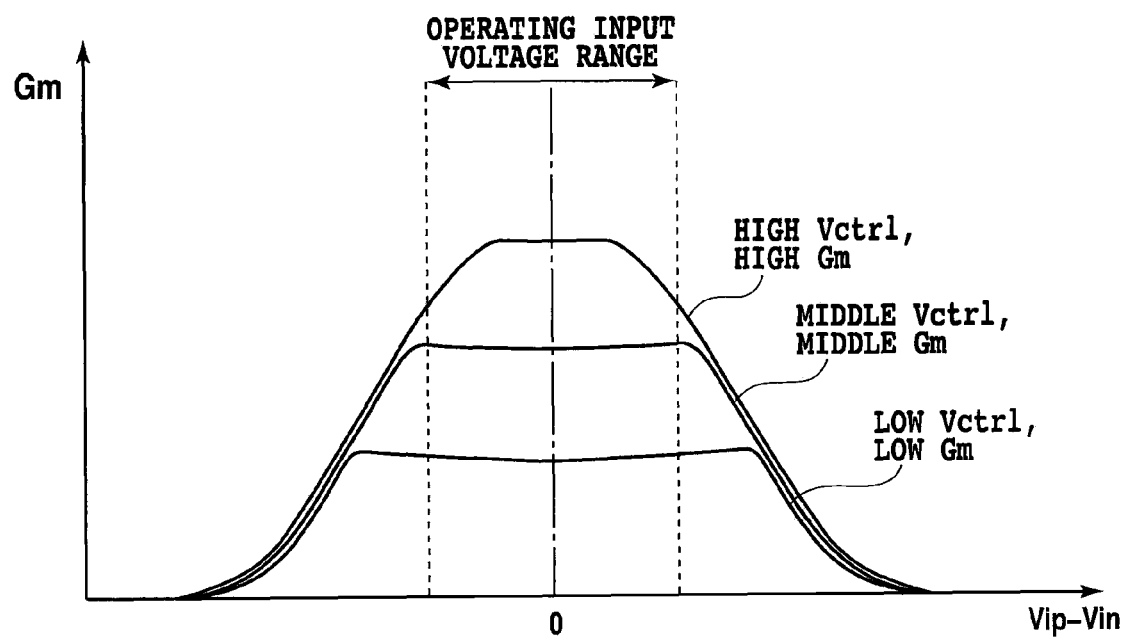
FIG. 2 is a graph of assistance in explaining the operation of the conventional transconductance amplifier as subjected to tuning.
Figure 3:
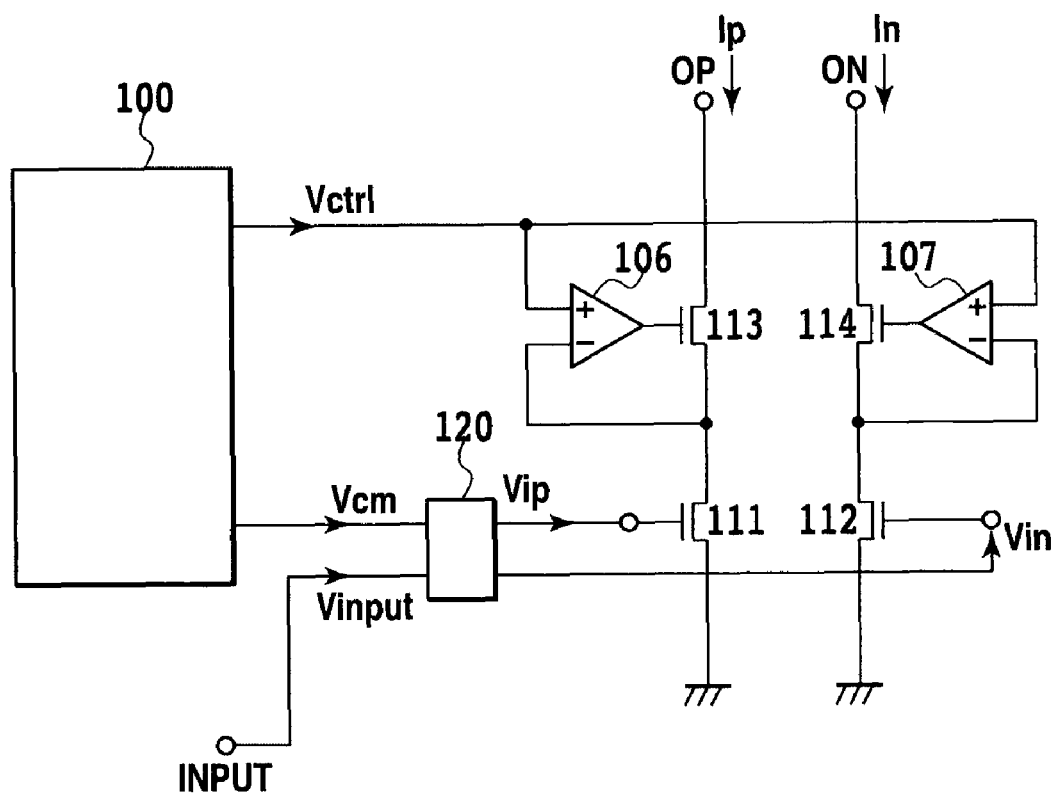
FIG. 3 is a circuit diagram of a transconductance amplifier according to the present invention.

FIG. 3 shows a circuit diagram of a transconductance amplifier according to a first embodiment of the present invention. As shown in FIG. 3, the transconductance amplifier according to the first embodiment is configured of a differential pair formed of MOS transistors 111 and 112 having a common source, MOS transistors 113 and 114, amplifiers 106 and 107, a voltage generator circuit 100, and a differential-pair input voltage generator circuit 120.

The voltage generator circuit 100 generates a common voltage Vcm of each of all differential signals inputted to the differential pair and a tuning voltage Vctrl that controls transconductance. The voltage generator circuit 100 has connections so that the tuning voltage Vctrl can be outputted to positive input terminals of the amplifiers 106 and 107 and so that the voltage Vcm can be outputted to the differential-pair input voltage generator circuit 120. Drain terminals of the MOS transistors 111 and 112 are connected to source terminals of the MOS transistors 113 and 114, respectively, and gate terminals of the MOS transistors 111 and 112 are connected to output terminals for voltages Vip and Vin, respectively, of the differential-pair input voltage generator circuit 120. The differential-pair input voltage generator circuit 120 is supplied with an input voltage Vinput inputted through an input terminal INPUT and the common voltage Vcm, and generates the voltage Vip and the voltage Vin. Negative input terminals of the amplifiers 106 and 107 have connections to the drain terminals of the MOS transistors 111 and 112, respectively, and have connections to the source terminals of the MOS transistors 113 and 114, respectively. Moreover, output terminals of the amplifiers 106 and 107 are connected to gate terminals of the MOS transistors 113 and 114, respectively. Also, adjustments are performed so that the MOS transistors 111 and 112 operate in a triode region and so that the MOS transistors 113 and 114 operate in a saturation region.

Figure 10:
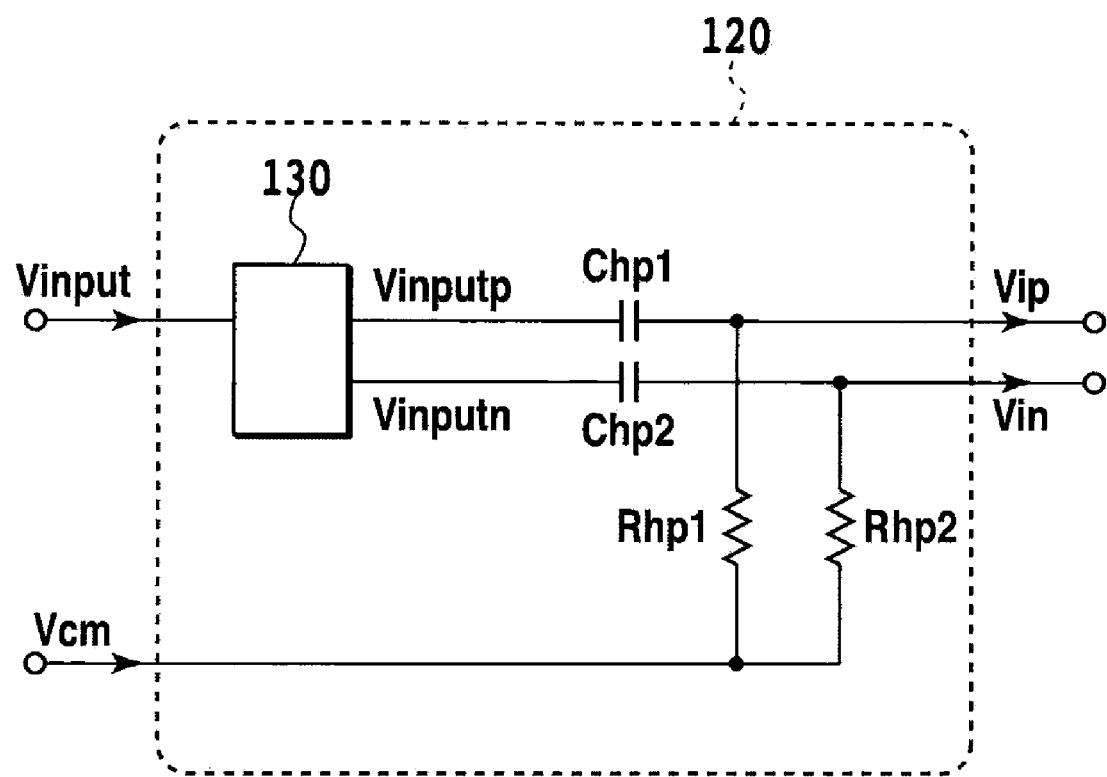
FIG. 10 is a diagram showing one embodiment of a differential-pair input voltage generator circuit 120 according to the present invention.

FIG. 10 shows one embodiment of the differential-pair input voltage generator circuit 120. The differential-pair input voltage generator circuit 120 is supplied with the common voltage Vcm and the input voltage Vinput substantially equivalent to a difference between the voltage Vip and the voltage Vin (an input to the transconductance amplifier), and outputs the voltages Vip and Vin to be inputted to the differential pair.

The input voltage Vinput is changed into differential signals Vinputp and Vinputn through a single differential converter circuit 130. Subsequently, the reference voltages of the signals are corrected to the common voltage Vcm by an HPF (high-pass filter) configured of resistances Rhp1 and Rhp2 and capacitances Chp1 and Chp2. The signals are then outputted to the gate terminals of the MOS transistors 111 and 112. Of course, the voltages to be inputted to the differential pair may be generated directly from the differential signals Vinputp and Vinputn without the use of the single differential converter circuit 130.

Figure 11:
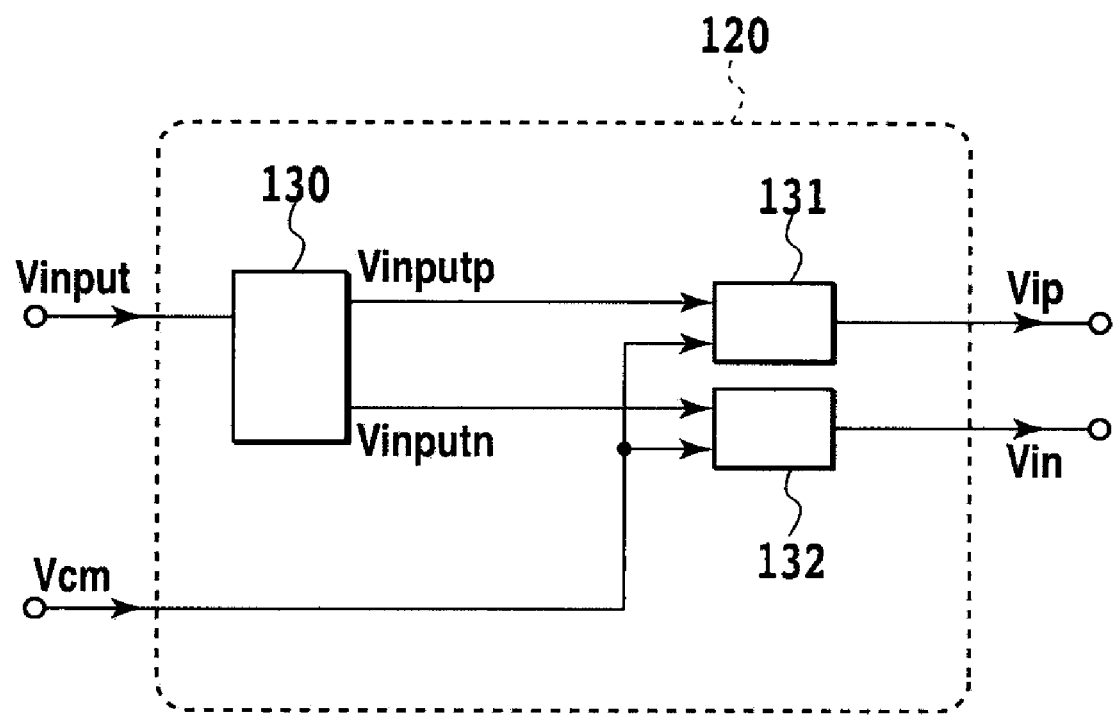
FIG. 11 is a diagram showing another embodiment of the differential-pair input voltage generator circuit 120 according to the present invention.

FIG. 11 shows another embodiment of the differential-pair input voltage generator circuit 120. The differential-pair input voltage generator circuit 120 is supplied with the common voltage Vcm and the input voltage Vinput substantially equivalent to the difference between the voltage Vip and the voltage Vin (the input to the transconductance amplifier), and outputs the voltages Vip and Vin to be inputted to the differential pair.

The input voltage Vinput is changed into the differential signals Vinputp and Vinputn through the single differential converter circuit 130. Subsequently, the reference voltages of the signals are corrected to the common voltage Vcm by level shift circuits 131 and 132. The signals are then outputted to the gate terminals of the MOS transistors 111 and 112. Of course, the voltages to be inputted to the differential pair may be generated directly from the differential signals Vinputp and Vinputn without the use of the single differential converter circuit 130.

It may be here additionally noted that the differential-pair input voltage generator circuit is not limited only to the above two embodiments.

With this configuration, the circuit shown in FIG. 3 functions as the transconductance amplifier, provided that the difference Vip−Vin between the voltages Vip and Vin developed at the gate terminals of the MOS transistors 111 and 112 is taken as the input voltage, and that a difference Ip−In between currents Ip and In flowing through drain terminals OP and ON of the MOS transistors 113 and 114 is taken as an output current.

Figure 4:
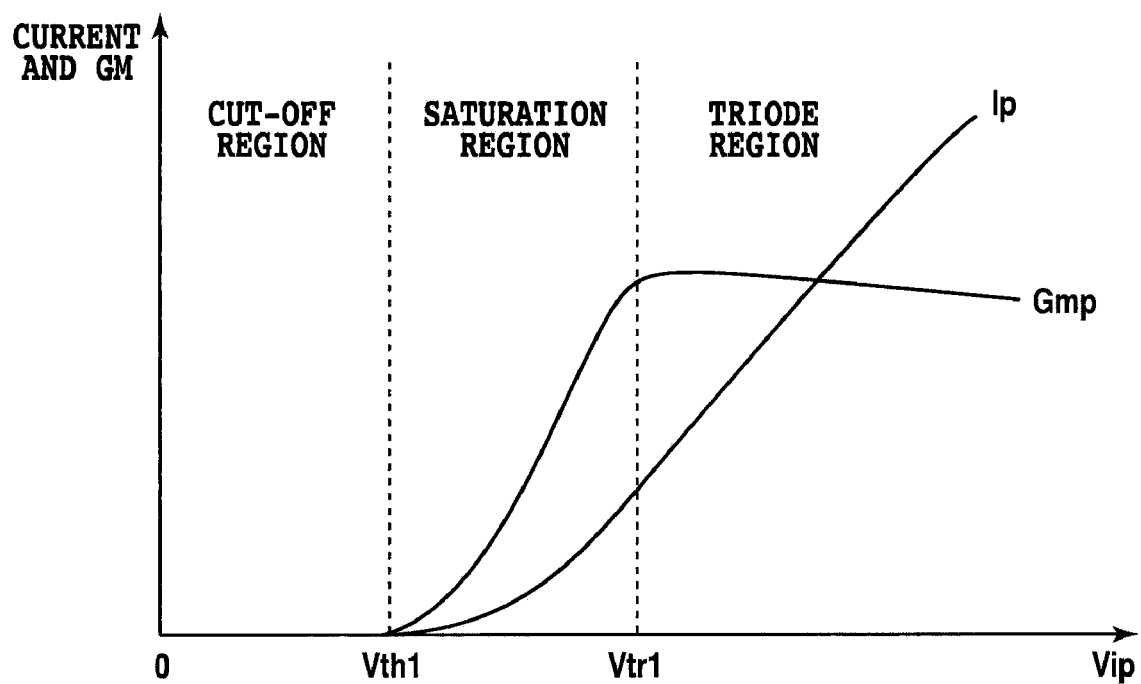
FIG. 4 is a graph explaining the operation of a MOS transistor 111.

Referring now to FIG. 4, there is shown the value of the current Ip relative to the gate voltage Vip of the MOS transistor 111, in conjunction with a value calculated by differentiating the current Ip with respect to the gate voltage Vip, that is, transconductance Gmp of the MOS transistor 111. Description will be given below with reference to FIG. 4 with regard to how the current Ip varies according to the gate voltage Vip of the MOS transistor 111, focusing on the MOS transistor 111.

The amplifiers 106 and 107 and the MOS transistors 113 and 114 are used to thereby keep the drain voltages of the MOS transistors 111 and 112 that form the differential pair constant (or equivalently, equal to Vctrl) to input variations at all times.

In a region where the gate voltage Vip lies between 0 V and a threshold voltage Vth1 of the MOS transistor 111, the current Ip is zero (or equivalently, in a cut-off region).

In a region where the gate voltage Vip is such that Vth1<Vip<Vctrl+Vth1, the MOS transistor 111 operates in the saturation region, and, at that time, the current Ip is expressed by Equation (1):

$$I_p = k_1 (V_{ip} - V_{th1})^2 \quad (1)$$

where $k_1$ denotes a coefficient depending on a transistor size and a production process. Further, in a region where Vip is such that Vip>Vctrl+Vth1, the MOS transistor 111 operates in the triode region, and, at that time, the current Ip is expressed by Equation (2).

$$I_p = k_1 \{2(V_{ip} - V_{th1}) \cdot V_{ctrl} - V_{ctrl}^2\} \quad (2)$$

Here, assuming that the gate voltage Vip that forms a boundary between the saturation region and the triode region is set to Vtr1 leads to Equation (3).

$$V_{tr1} = V_{ctrl} + V_{th1} \quad (3)$$

Description will be given below with reference to FIG. 5 with regard to the differential pair formed of the MOS transistors 111 and 112.

The gate voltage of the MOS transistor 112 is set to Vin. Further, if an input differential common voltage for the gate voltage Vip and the gate voltage Vin is set to Vcm, the gate voltage Vin is given by Equation (4).

$$V_{in} = 2 \cdot V_{cm} - V_{ip} \quad (4)$$

Figure 5:
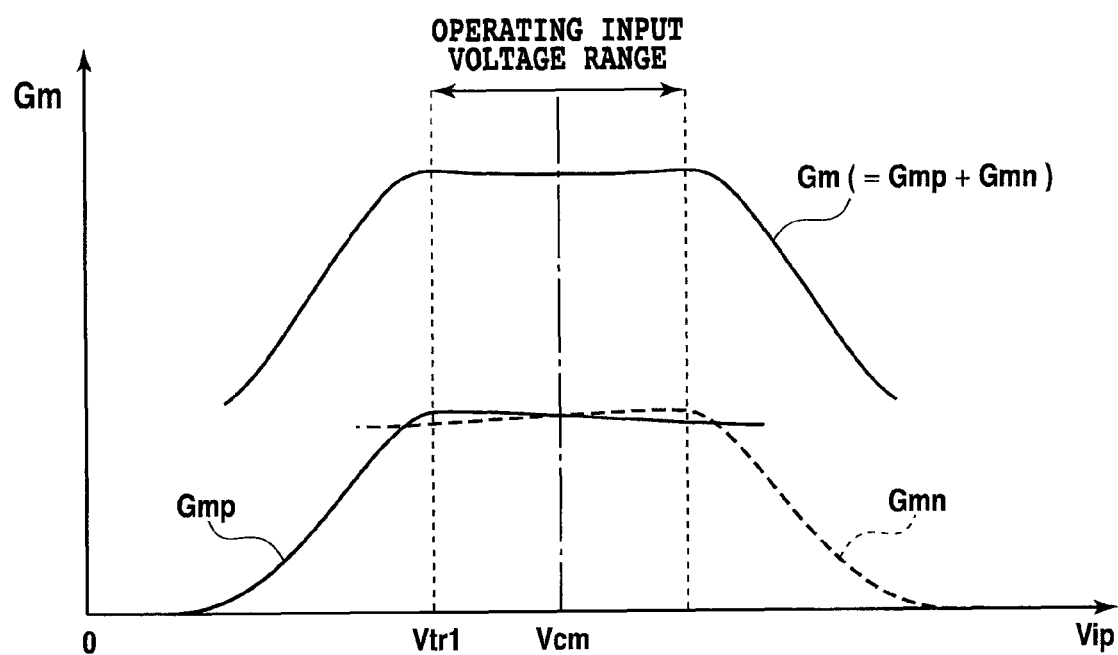
FIG. 5 is a graph explaining the operation of a differential pair.

Therefore, when the gate voltage Vip is changed, the absolute value of transconductance Gmn of the MOS transistor 112 varies just like the Gmp curve returned at the common voltage Vcm, as shown in FIG. 5.

The total transconductance Gm of the differential pair is given by calculating the sum of Gmp and Gmn. As shown in FIG. 5, the total transconductance Gm can achieve good linearity within a range of ±(Vcm−Vtr1), centered at Vcm. It is to be here noted that Vcm is set such that Vtr1<Vcm in order that both the MOS transistors 111 and 112 operate in the triode region.

Here, the present invention is characterized in that, for tuning of the transconductance, a region having good linearity is controlled by controlling the input differential common voltage Vcm as well as the tuning voltage Vctrl. Specifically, the common voltage is adjusted by the voltage generator circuit 100 so that a difference between the common voltage and the tuning voltage is equal to a constant. When Vcm minus Vtr1 (Vcm−Vtr1) is calculated from Equation (3), Vcm minus Vtr1 (Vcm−Vtr1) can be expressed as Equation (5).

$$V_{cm} - V_{tr1} = V_{cm} - V_{ctrl} - V_{th1} \quad (5)$$

From Equation (5), it is found that the adjustment is performed so that the difference between the common voltage Vcm and the tuning voltage Vctrl is equal to the constant, thereby enabling a reduction in the influence of the tuning voltage Vctrl upon Vcm minus Vtr1 (Vcm−Vtr1).

In other words, even if the tuning voltage Vctrl is changed for purposes of the tuning of the transconductance, adjustment of the input differential common voltage Vcm in accordance with the change in the tuning voltage Vctrl enables keeping constant a range in which the transconductance amplifier can achieve good linearity. (See FIG. 6.)

In particular, when the voltage generator circuit 100 is adjusted so that Equation (6) is satisfied, substitution of Equation (6) into Equation (5) yields Equation (7).

$$V_{cm} - V_{ctrl} = \beta + V_{th1} \quad (6)$$

$$V_{cm} - V_{tr1} = \beta \quad (7)$$

Figure 6:
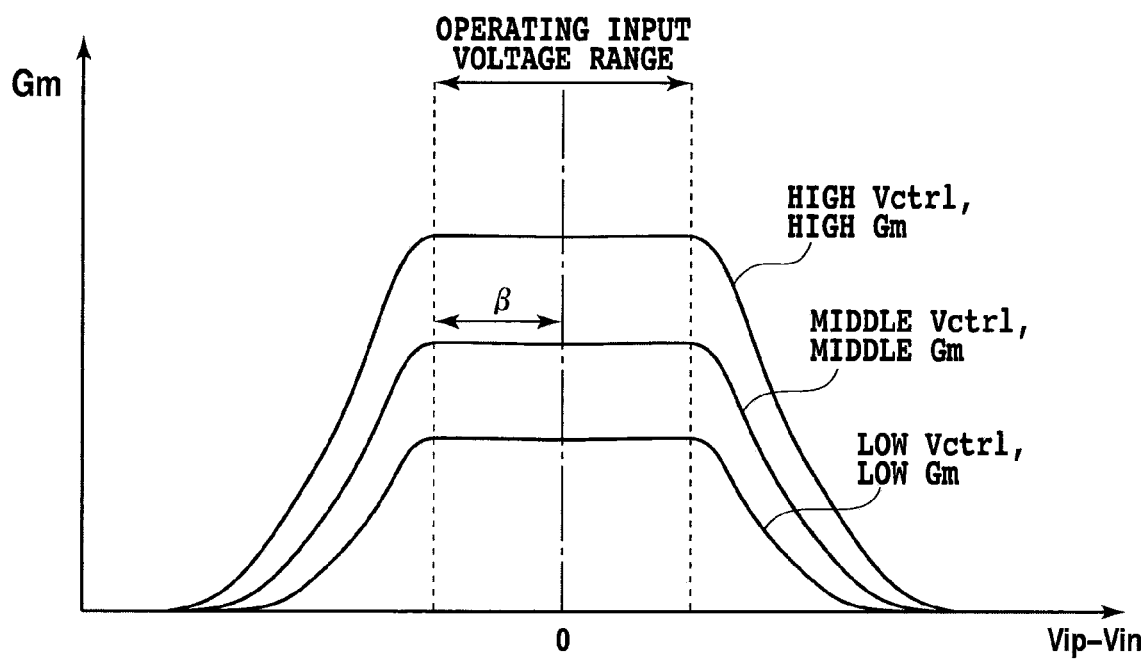
FIG. 6 is a graph explaining the operation of a transconductance amplifier according to an embodiment of the present invention, as subjected to tuning.

In short, the transconductance amplifier can have good linearity in a range from +β to −β, as shown in FIG. 6. Here, β denotes any given constant.

Thereby, the present invention can provide the transconductance amplifier having a wide transconductance tuning range by suppressing the variation in the range in which the transconductance amplifier has good linearity in the range of operating input voltages, depending on the magnitude of the tuning voltage Vctrl.

Second Embodiment

Figure 7:
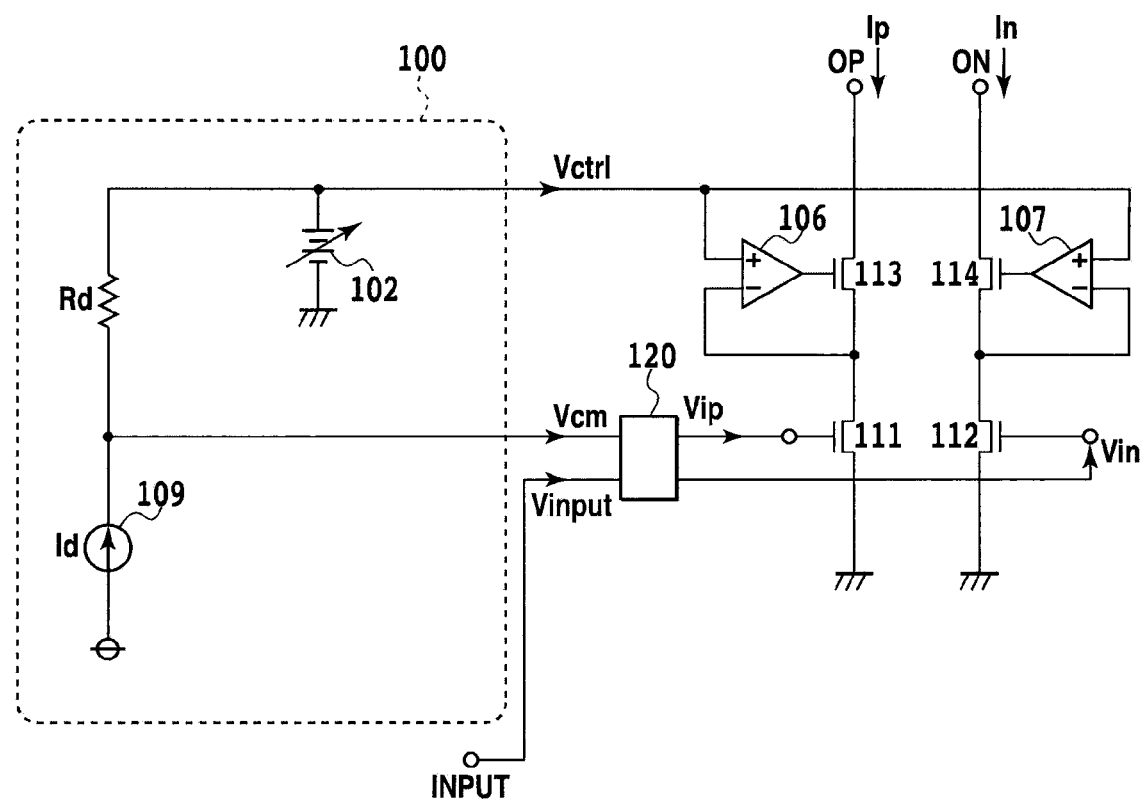
FIG. 7 is a circuit diagram of a transconductance amplifier according to a second embodiment of the present invention.

FIG. 7 shows a circuit diagram of a transconductance amplifier according to a second embodiment of the present invention. The transconductance amplifier according to the second embodiment is configured of the differential pair formed of the MOS transistors 111 and 112 having the common source, the MOS transistors 113 and 114, the amplifiers 106 and 107, the voltage generator circuit 100, and the differential-pair input voltage generator circuit 120.

The voltage generator circuit 100 generates a common voltage Vcm of each of all differential signals inputted to the differential pair and a tuning voltage Vctrl that controls transconductance. The voltage generator circuit 100 has connections so that the tuning voltage Vctrl can be outputted to the positive input terminals of the amplifiers 106 and 107 and so that the voltage Vcm can be outputted to the differential-pair input voltage generator circuit 120. The drain terminals of the MOS transistors 111 and 112 are connected to the source terminals of the MOS transistors 113 and 114, respectively, and the gate terminals of the MOS transistors 111 and 112 are connected to the output terminals for the voltages Vip and Vin, respectively, of the differential-pair input voltage generator circuit 120. The differential-pair input voltage generator circuit 120 is supplied with the common voltage Vcm and the input voltage Vinput inputted through the input terminal INPUT, and generates the voltage Vip and the voltage Vin. The negative input terminals of the amplifiers 106 and 107 have connections to the drain terminals of the MOS transistors 111 and 112, respectively, and have connections to the source terminals of the MOS transistors 113 and 114, respectively. Also, the output terminals of the amplifiers 106 and 107 are connected to the gate terminals of the MOS transistors 113 and 114, respectively. Also, adjustments are performed so that the MOS transistors 111 and 112 operate in the triode region and so that the MOS transistors 113 and 114 operate in the saturation region.

As shown in FIG. 7, the transconductance amplifier according to the second embodiment is adapted to use a configuration as given below, in place of the configuration of the voltage generator circuit 100 according to the first embodiment. Specifically, the voltage generator circuit 100 is configured of a voltage generator 102, a fixed current source 109 and a resistance Rd. The resistance Rd is connected between the voltage generator 102 and the fixed current source 109, and connected to the output side of the fixed current source 109. The resistance Rd is not limited only to a resistor made of polysilicon formed on a chip but may be formed of, for example, metal wiring, a MOS transistor operated in the triode region, or the like.

Here, the product Rd×Id of the resistance Rd and a fixed current Id is equal to the difference between Vcm and Vctrl, provided that an output from the voltage generator 102 is set to Vctrl, and that either a voltage at a contact point between the fixed current source 109 and the resistance Rd or a voltage outputted from a voltage follower connected to the contact point is set to Vcm. The configuration shown in FIG. 7, as mentioned above, enables keeping the voltage difference between Vcm and Vctrl constant at all times, and such configuration that the difference is equal to β plus Vth1 (β+Vth1) enables the transconductance amplifier to have good linearity in the range from +β to −β, which is derived from Equation (5). Here, β denotes any given constant. Setting the output voltage from the voltage generator 102 to a desired value enables the tuning voltage Vctrl and the common voltage Vcm to have desired values. Here, the output voltage from the voltage generator 102 may be variable, or the output voltage value may be fixed after the tuning voltage Vctrl and the common voltage Vcm are set to the desired values.

Accordingly, the second embodiment achieves the transconductance amplifier having a wide transconductance tuning range by suppressing the variation in the range in which the transconductance amplifier has good linearity in the range of operating input voltages, depending on the magnitude of the tuning voltage Vctrl.

Third Embodiment

Figure 8:
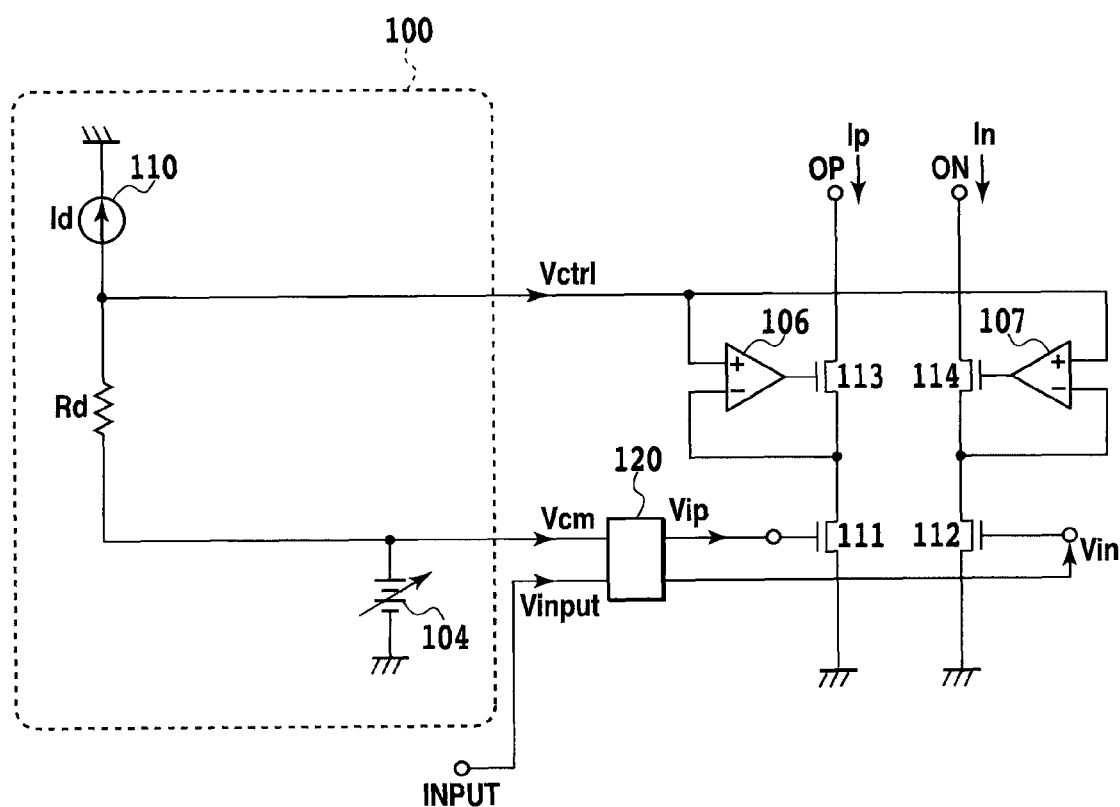
FIG. 8 is a circuit diagram of a transconductance amplifier according to a third embodiment of the present invention.

FIG. 8 shows a circuit diagram of a transconductance amplifier according to a third embodiment of the present invention. The transconductance amplifier according to the third embodiment is configured of the differential pair formed of the MOS transistors 111 and 112 having the common source, the MOS transistors 113 and 114, the amplifiers 106 and 107, the voltage generator circuit 100, and the differential-pair input voltage generator circuit 120.

The voltage generator circuit 100 generates a common voltage Vcm of each of all differential signals inputted to the differential pair and a tuning voltage Vctrl that controls transconductance. The voltage generator circuit 100 has connections so that the tuning voltage Vctrl can be outputted to the positive input terminals of the amplifiers 106 and 107 and so that the voltage Vcm can be outputted to the differential-pair input voltage generator circuit 120. The differential-pair input voltage generator circuit 120 is supplied with the common voltage Vcm and the input voltage Vinput inputted through the input terminal INPUT, and generates the voltage Vip and the voltage Vin. The drain terminals of the MOS transistors 111 and 112 are connected to the source terminals of the MOS transistors 113 and 114, respectively, and the gate terminals of the MOS transistors 111 and 112 are connected to the output terminals for the voltages Vip and Vin, respectively, of the differential-pair input voltage generator circuit 120. The negative input terminals of the amplifiers 106 and 107 have connections to the drain terminals of the MOS transistors 111 and 112, respectively, and have connections to the source terminals of the MOS transistors 113 and 114, respectively. Also, the output terminals of the amplifiers and 107 are connected to the gate terminals of the MOS transistors 113 and 114, respectively. Also, adjustments are performed so that the MOS transistors 111 and 112 operate in the triode region and so that the MOS transistors 113 and 114 operate in the saturation region.

As shown in FIG. 8, the transconductance amplifier according to the third embodiment is adapted to use a configuration as given below, in place of the configuration of the voltage generator circuit 100 according to the first embodiment. Specifically, the voltage generator circuit 100 is configured of a voltage generator 104, a fixed current source 110 and the resistance Rd. The resistance Rd is connected between the voltage generator 104 and the fixed current source 110, and connected to the input side of the fixed current source 110. The resistance Rd is not limited only to the resistor made of polysilicon formed on the chip but may be formed of, for example, the metal wiring, the MOS transistor operated in the triode region, or the like.

Here, the product Rd×Id of the resistance Rd and the fixed current Id is equal to the difference between Vcm and Vctrl, provided that an output from the voltage generator 104 is set to Vcm, and that either a voltage at a contact point between the fixed current source 110 and the resistance Rd or a voltage outputted from a voltage follower connected to the contact point is set to Vctrl. The configuration shown in FIG. 8, as mentioned above, enables keeping the voltage difference between Vcm and Vctrl constant at all times, and such configuration that the difference is equal to β plus Vth1 (β+Vth1) enables the transconductance amplifier to have good linearity in the range from +β to −β, which is derived from Equation (5). Here, β denotes any given constant. Setting the output voltage from the voltage generator 104 to a desired value enables the common voltage Vcm and the tuning voltage Vctrl to have desired values. Here, the output voltage from the voltage generator 104 may be variable, or the output voltage value may be fixed after the common voltage Vcm and the tuning voltage Vctrl are set to the desired values.

Therefore, the third embodiment achieves the transconductance amplifier having a wide transconductance tuning range by suppressing the variation in the range in which the transconductance amplifier has good linearity in the range of operating input voltages, depending on the magnitude of the tuning voltage Vctrl.

Fourth Embodiment

Figure 9:
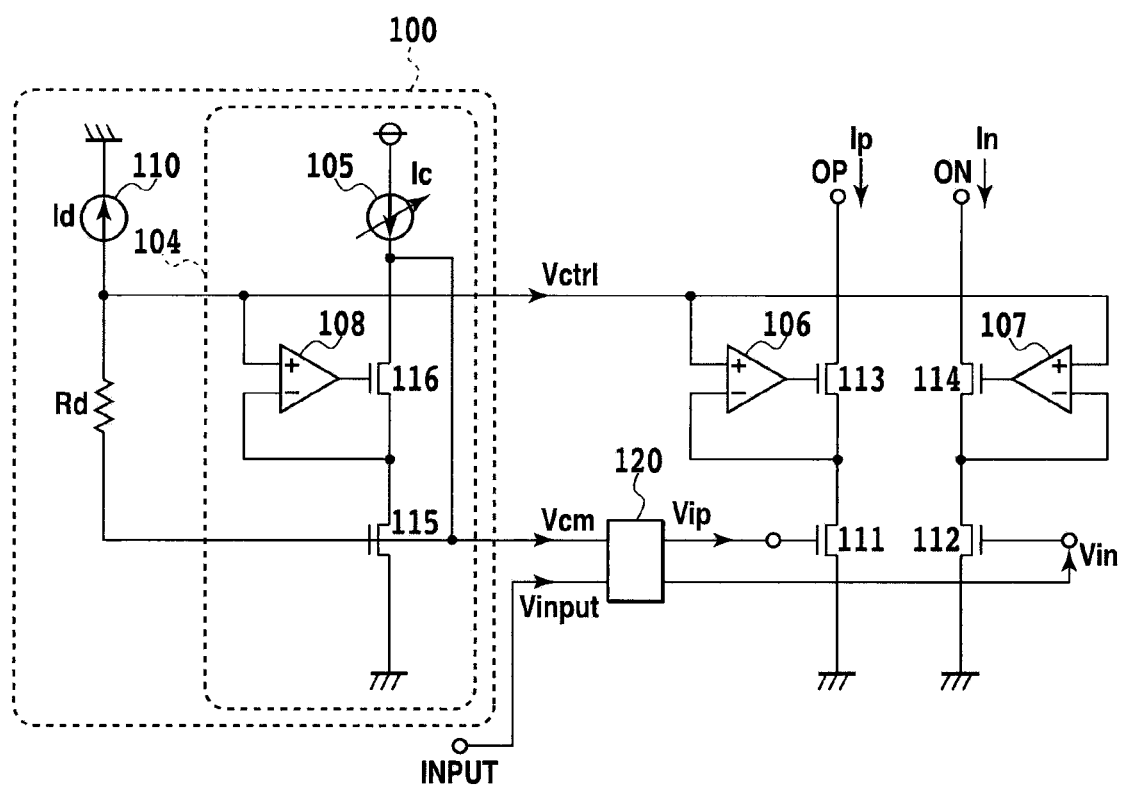
FIG. 9 is a circuit diagram of a transconductance amplifier according to a fourth embodiment of the present invention.

FIG. 9 shows a circuit diagram of a transconductance amplifier according to a fourth embodiment of the present invention. The transconductance amplifier according to the fourth embodiment is configured of the differential pair formed of the MOS transistors 111 and 112 having the common source, the MOS transistors 113 and 114, the amplifiers 106 and 107, the voltage generator circuit 100, and the differential-pair input voltage generator circuit 120.

The voltage generator circuit 100 generates a common voltage Vcm of each of all differential signals inputted to the differential pair and a tuning voltage Vctrl that controls transconductance. The voltage generator circuit 100 has connections so that the tuning voltage Vctrl can be outputted to the positive input terminals of the amplifiers 106 and 107 and so that the voltage Vcm can be outputted to the differential-pair input voltage generator circuit 120. The drain terminals of the MOS transistors 111 and 112 are connected to the source terminals of the MOS transistors 113 and 114, respectively, and the gate terminals of the MOS transistors 111 and 112 are connected to the output terminals for the voltages Vip and Vin, respectively, of the differential-pair input voltage generator circuit 120. The differential-pair input voltage generator circuit 120 is supplied with the input voltage Vinput inputted through the input terminal INPUT and the common voltage Vcm, and generates the voltage Vip and the voltage Vin. The negative input terminals of the amplifiers 106 and 107 have connections to the drain terminals of the MOS transistors 111 and 112, respectively, and have connections to the source terminals of the MOS transistors 113 and 114, respectively. Also, the output terminals of the amplifiers 106 and 107 are connected to the gate terminals of the MOS transistors 113 and 114, respectively. Also, adjustments are performed so that the MOS transistors 111 and 112 operate in the triode region and so that the MOS transistors 113 and 114 operate in the saturation region.

The voltage generator circuit 100 is configured of the voltage generator 104, the fixed current source 110 and the resistance Rd. The resistance Rd is connected between the voltage generator 104 and the fixed current source 110, and connected to the input side of the fixed current source 110. The resistance Rd is not limited only to the resistor made of polysilicon formed on the chip but may be formed of, for example, the metal wiring, the MOS transistor operated in the triode region, or the like.

As shown in FIG. 9, the transconductance amplifier according to the fourth embodiment is adapted to use a configuration as given below, in place of the configuration of the voltage generator 104 according to the third embodiment. Specifically, the voltage generator 104 is configured of a current source 105, MOS transistors 115 and 116, and an amplifier 108. A drain terminal of the MOS transistor 115 having a common source and a source terminal of the MOS transistor 116 are connected to each other. The drain terminal of the MOS transistor 116 is connected to the output side of the current source 105. A contact point between the MOS transistor 116 and the current source 105 is connected to a gate terminal of the MOS transistor 115. A positive input terminal of the amplifier 108 is connected to the contact point between the fixed current source 110 and the resistance Rd, and a negative input terminal thereof is connected to the drain terminal of the MOS transistor 115 and the source terminal of the MOS transistor 116. An output of the amplifier 108 is connected to a gate terminal of the MOS transistor 116.

Here, the product Rd×Id of the resistance Rd and the fixed current Id is equal to the difference between Vcm and Vctrl, provided that the output from the voltage generator 104, that is, a voltage at the contact point of the drain terminal of the MOS transistor 116, the current source 105 and the gate terminal of the MOS transistor 115, is set to Vcm, and that either the voltage at the contact point between the fixed current source 110 and the resistance Rd or a voltage outputted from a voltage follower connected to the contact point is set to Vctrl. The configuration shown in FIG. 9, as mentioned above, enables keeping the voltage difference between Vcm and Vctrl constant at all times, and such configuration that the difference is equal to $\beta$ plus Vth1 ($\beta$+Vth1) enables the transconductance amplifier to have good linearity in the range from $+\beta$ to $-\beta$, which is derived from Equation (5). Here, $\beta$ denotes any given constant. Setting an output current from the current source 105 to a desired value allows the output from the voltage generator 104 to have a desired value, thus enabling the tuning voltage Vctrl and the common voltage Vcm to have desired values. Here, the output current from the current source 105 may be variable, or the output current value may be fixed after the setting of the output current from the current source 105 such that the tuning voltage Vctrl and the common voltage Vcm have the desired values.

Desirably, the MOS transistor 115 is of such a transistor size that the MOS transistor 115 has a current-mirror relationship to the MOS transistors 111 and 112 that constitute the transconductance amplifier, and the MOS transistor 116 is of such a transistor size that the MOS transistor 116 has a current-mirror relationship to the MOS transistors 113 and 114. Specifically, if a current mirror ratio is set to, for example, $\gamma$, configuration is such that the transistor size of the MOS transistor 115 multiplied by $\gamma$ ($\times\gamma$) is equal to the transistor size of the MOS transistors 111 and 112 and that the transistor size of the MOS transistor 116 multiplied by $\gamma$ ($\times\gamma$) is equal to the transistor size of the MOS transistors 113 and 114. At this point, the currents Ip and In are determined by the current mirror with the mirror ratio $\gamma$, resulting in Ip=$\gamma\times$(Ic−Id) and In=$\gamma\times$(Ic−Id), respectively, where Ic denotes the output current from the current source 105.

Thereby, the fourth embodiment achieves the transconductance amplifier having a wide transconductance tuning range by suppressing the variation in the range in which the transconductance amplifier has good linearity in the range of operating input voltages, depending on the magnitude of the tuning voltage Vctrl. The transconductance amplifier is further characterized by the feature that the currents Ip and In flowing through the MOS transistors 111 and 112 that form the differential pair can be determined directly by the current source 105 with the current mirror ratio.

The invention claimed is:

1. A transconductance amplifier which supplies an output current proportional to an input voltage, characterized by comprising:

a differential pair which is formed of first and second MOS transistors having a common source, and which operates in a triode region;

a third MOS transistor of which a source terminal is connected to a drain terminal of the first MOS transistor, and which operates in a saturation region;

a fourth MOS transistor of which a source terminal is connected to a drain terminal of the second MOS transistor, and which operates in the saturation region;

a first amplifier of which a negative input terminal is connected to the source terminal of the third MOS transistor and of which an output terminal is connected to a gate terminal of the third MOS transistor;

a second amplifier of which negative input terminal is connected to the source terminal of the fourth MOS transistor and of which output terminal is connected to a gate terminal of the fourth MOS transistor;

a voltage generator circuit which generates a tuning voltage inputted to positive input terminal voltages of the first and second amplifiers, and a common voltage of first and second voltages inputted to the differential pair so that a difference between the tuning voltage and the common voltage is equal to a constant; and a differential-pair input voltage generator circuit which is supplied with a common voltage, and which generates the first voltage outputted to a gate terminal of the first MOS transistor, and the second voltage outputted to a gate terminal of the second MOS transistor, characterized in that the second voltage is equal to 2×(the common voltage)−(the first voltage), the input voltage is equal to a difference between the first voltage and the second voltage, and the output current is equal to a difference between a first current Ip flowing through the drains and sources of the first and third MOS transistors and a second current In flowing through the drains and sources of the second and fourth MOS transistors.

2. The transconductance amplifier according to claim 1, characterized in that the voltage generator circuit includes a voltage generator, a fixed current source, and a resistance connected in series between the voltage generator and an output terminal of the fixed current source, the tuning voltage is outputted from between the voltage generator and the resistance, and the common voltage is outputted from between the resistance and the fixed current source.

3. The transconductance amplifier according to claim 1, characterized in that the voltage generator circuit includes a voltage generator, a fixed current source, and a resistance connected in series between the voltage generator and an input terminal of the fixed current source, the common voltage is at a contact point between the voltage generator and the resistance, and the tuning voltage is at a contact point between the resistance and the fixed current source.

4. The transconductance amplifier according to claim 3, characterized in that the voltage generator includes a second current source, fifth and sixth MOS transistors, and a third amplifier, which are connected in series, a source terminal of the sixth MOS transistor, a drain terminal of the fifth transistor, and a negative input terminal of the third amplifier are connected to one another, a gate terminal of the fifth transistor having a common source is connected to a drain terminal of the sixth MOS transistor and an output terminal of the second current source, a gate voltage of the fifth MOS transistor is the common voltage, and a positive input terminal voltage of the third amplifier is the tuning voltage.

5. The transconductance amplifier according to claim 4, characterized in that the fifth MOS transistor is configured to have a current-mirror relationship to the first and second MOS transistors, and the sixth MOS transistor is configured to have a current-mirror relationship to the third and fourth MOS transistors.

6. The transconductance amplifier according to any one of claims 4 and 5, characterized in that the second current source is variable.

7. The transconductance amplifier according to any one of claims 2 to 5, characterized in that the voltage generator is variable.

8. The transconductance amplifier according to claim 6, characterized in that the voltage generator is variable.

* * * * *